(12) United States Patent
Calanni et al.

(10) Patent No.: US 6,361,335 B1
(45) Date of Patent: Mar. 26, 2002

(54) SNAP-IN MODULE INSERTER/EJECTOR WITH BOARD MOUNT AND ALIGNMENT FEATURES

(75) Inventors: Daniel J. Calanni; Jay H. Dorval, both of Plano, TX (US)

(73) Assignee: Ericsson Inc., Research Triangle Park, NC (US)

(*) Notice: Subject to any disclaimer, the term of this patent is extended or adjusted under 35 U.S.C. 154(b) by 0 days.

(21) Appl. No.: 09/326,528

(22) Filed: Jun. 4, 1999

(51) Int. Cl.[7] .............................................. H01R 13/62
(52) U.S. Cl. ........................................ 439/152; 439/157
(58) Field of Search ................................ 439/157, 159, 439/754, 755, 152–156, 911; 361/726, 732, 740, 747, 754, 755, 759, 798, 801

(56) References Cited

U.S. PATENT DOCUMENTS

| | | | |
|---|---|---|---|
| 4,699,594 A | * 10/1987 | Assel et al. | 439/152 |
| 4,975,073 A | 12/1990 | Weisman | 439/157 |
| 5,000,494 A | * 3/1991 | Guibleo | 292/148 |
| 5,373,419 A | * 12/1994 | Wright | 361/755 |
| 5,428,507 A | * 6/1995 | Chatel et al. | 361/798 |
| 5,504,656 A | * 4/1996 | Joist | 361/754 |

FOREIGN PATENT DOCUMENTS

GB          2 334 151 A    * 11/1999

* cited by examiner

Primary Examiner—Brian Sircus
Assistant Examiner—Son V. Nguyen
(74) Attorney, Agent, or Firm—Jenkens & Gilchrist, P.C.

(57) ABSTRACT

An improved inserter/ejector device is disclosed for the insertion or removal of printed circuit boards (PCBs), particularly in environments in which many such boards are to be located in close proximity. In such environments, it is often difficult, if not impossible, to reach between boards so that one may be inserted or removed without damaging others. The inserter/ejector provides various improvements over the prior art, for example, the PCB may attached on either side of a mounting portion using a threaded boss, and the device implements a lockable lever arm to ensure that the PCB is not accidentally removed. The present invention also features a guide pin which, when mated to a corresponding hole in a host system chassis, serves to positively locate the PCB relative to the host system chassis for proper insertion. The inserter/ejector further includes a label area molded into the lever arm for clearly identifying the attached PCB.

16 Claims, 3 Drawing Sheets

SNAP-IN MODULE INSERTER/EJECTOR WITH BOARD MOUNT AND ALIGNMENT FEATURES

BACKGROUND OF THE PRESENT INVENTION

Field of the Invention

The present invention relates to devices for facilitating the insertion or extraction of printed circuit boards or cards in connector-contact applications. Specifically, the present invention relates to an inserter/ejector having improved board mounting and alignment features.

Background and Objects of the Present Invention

The growing complexity of computer systems, e.g., in servers for telecommunications, requires the utilization of many interconnected components. A common way to interconnect the components is by usage of a number of printed circuit boards (PCBs), a number of which may be compactly housed in a computer chassis. With miniaturization, however, the numbers of components and PCBs within a given system increase as the amount of space decreases. It then becomes a problem to access components on a given PCB within an array of such circuit boards. For various reasons, e.g., narrow spacing, heat, and sensitivity of the components, removal of the given PCB is a delicate task.

Current techniques for removing PCBs employ the use of various lever-type devices which couple to the PCB or card by way of mounting pins affixed to the board. As noted, these lever-type devices are implemented for the insertion or extraction of PCBs into environments in which many such boards are located in close proximity, e.g., in large mainframe computers, servers or other high capacity computing systems. In such environments, it is often difficult, if not impossible, to reach between the respective boards so that one may be inserted or removed without damaging others.

An example of a conventional inserter/extractor, e.g., such as described in U.S. Pat. No. 4,975,073 issued to Weisman, is illustrated in FIG. 1, and generally designated therein by the reference numeral 100. As shown in the figure, the inserter/extractor 100 attaches to a PCB board 120 by two stainless steel pins, e.g., an upper pin 105 and a lower pin 110, mounted through respective openings 115A and 115B drilled though the board 120. In use, an opening 125 in a lower portion 130 of the inserter/extractor device 100 is fitted over the lower pin 110, about which the entire device 100 pivots.

With reference now to FIG. 2, there is illustrated a U-channel, generally designated by the reference numeral 200, at an end 205 of PCB 220 that is perpendicular to the particular connections or slots in which the PCBs are to be installed, and which may be used to provide an actuating surface. It should be understood that the U-channel is generally part of the host system chassis housing the PCB 220. With reference also to FIG. 1, as device 100 rotates about the lower pin 110, a cutout 135 in the lower portion 130 of the device 100 makes contact with the U-channel 200 and acts as a lever to facilitate insertion or extraction of the PCB 120 with relative ease. When not in use, the device 100 may be locked against the edge of the PCB 120 by clamping an upper portion 140 thereof about the upper pin 105 mounted through the board 120. It should be understood that a spring-loaded joint 150, employed between the upper 140 and lower 130 portions of the device 100, is similar to a spring-loaded joint found in a common clothes pin.

Such conventional devices may also be found in simpler ejector-only type forms which resemble a simplified lower portion of the device described above, i.e., lower portion 130 of device 100, and which are limited in use to extracting PCBs or cards 120 that have been previously installed.

While the aforementioned devices have been somewhat useful, these conventional inserter/extractors require pre-installation of one or more of the aforedescribed pins through the PCB, i.e., pins 105 and 110, lack a self aligning mechanism to assure proper alignment of the PCB upon insertion, and provide minimal space for labeling the board onto which the devices are attached. Accordingly, there is a need for an improved PCB inserter/ejector which installs with minimal hardware, has a self aligning mechanism for positive board location, and has a relatively large area for labeling.

SUMMARY OF THE INVENTION

In a preferred embodiment, the inserter/ejector of the present invention includes a body and a lever arm. The body is designed with a lip and has a flexible design to snap fit into a mounting panel, whereby a PCB is mounted thereto without the need of screws, pins or rods which must be pre-installed on the PCB as with conventional designs. The lever arm is pivotally attached to the body by a pair of hinge pins, and may be secured in a locked or fully inserted position by a locking mechanism portion of the body. The lever arm is provided with a cutout for actuating a U-channel and creating a lever action capable of providing significant force for the insertion or removal of an attached PCB. The lever arm also features a relatively large inset label area for clearly labeling the attached PCB. The improved inserter/ejector of the present invention further implements a guide pin for positive location or alignment of the PCB with a host system prior to insertion.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION OF THE PRESENTLY PREFERRED EXEMPLARY EMBODIMENTS

The numerous innovative teachings of the present application will be described with particular reference to the presently preferred exemplary embodiments. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
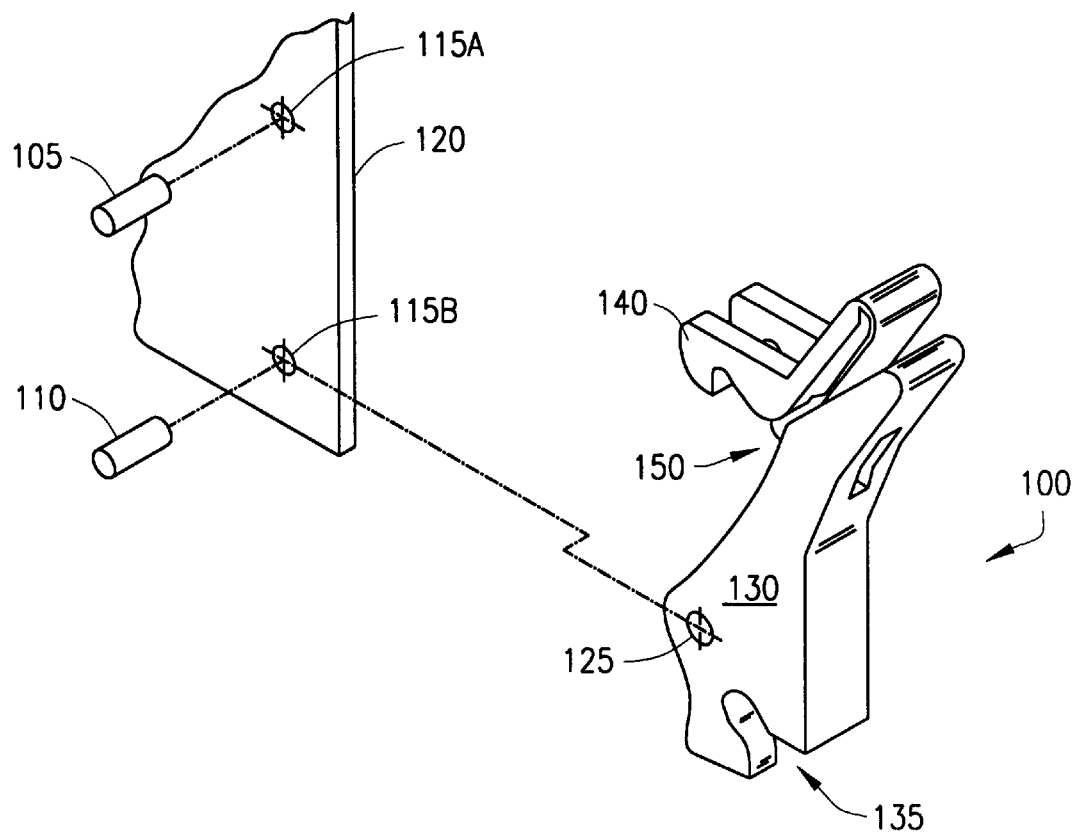
FIG. 1 is a left side perspective view of a conventional device used for insertion or extraction of PCBs showing a detail of the mounting pins which are to be inserted through the board.
Figure 2:
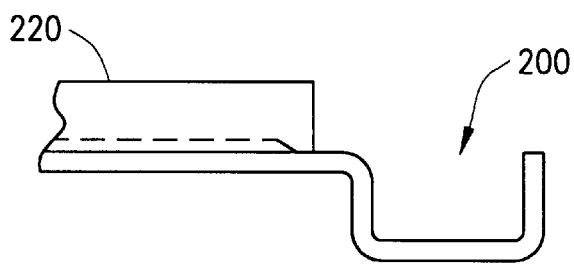
FIG. 2 is a left elevational view of a PC board having a U-shaped channel, which is perpendicular to the slots in which smaller PCBs or cards are to be inserted.
Figure 3:
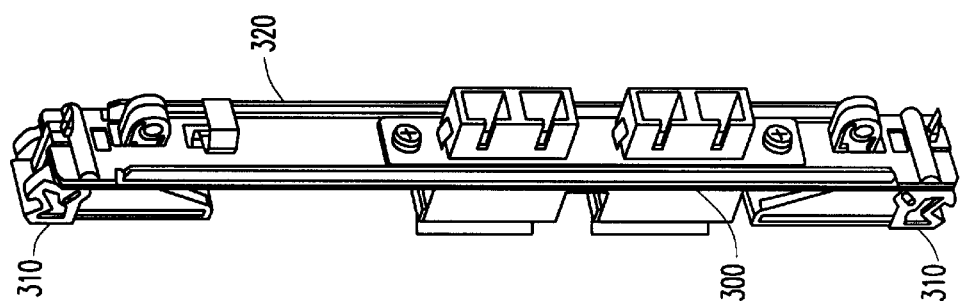
FIG. 3 is a right side perspective view of a mounting panel in accordance with a preferred embodiment of the present invention having two inserter/ejector devices secured thereto.

Referring again to the drawings, and more particularly to FIG. 3, there is shown a perspective view of a mounting panel 300 for a PC board 120 (shown in FIGS. 1 and 2) featuring two inserter/ejector devices 310 thereon in accordance with a preferred embodiment of the present invention. It should be understood that the mounting panel 300 is shown in FIG. 3 without the attached PC board so that the inserter/ejector devices 310 attached thereto may be illustrated more clearly. In use, a PC board or card 120/220 would be attached along either side of a mounting portion 320 of each inserter/ejector 310 via a threaded boss or other suitable fastener, as further illustrated in FIG. 6.

Figure 5:
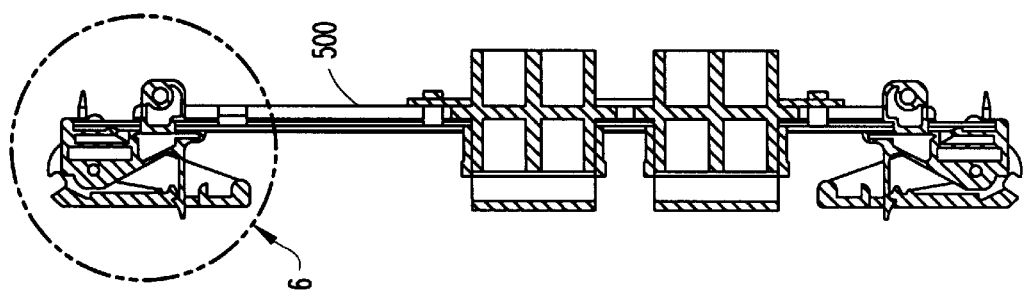
FIG. 5 is a right side cutaway view of the mounting panel shown in FIG. 4 and sectioned along line 5—5.
Figure 4:
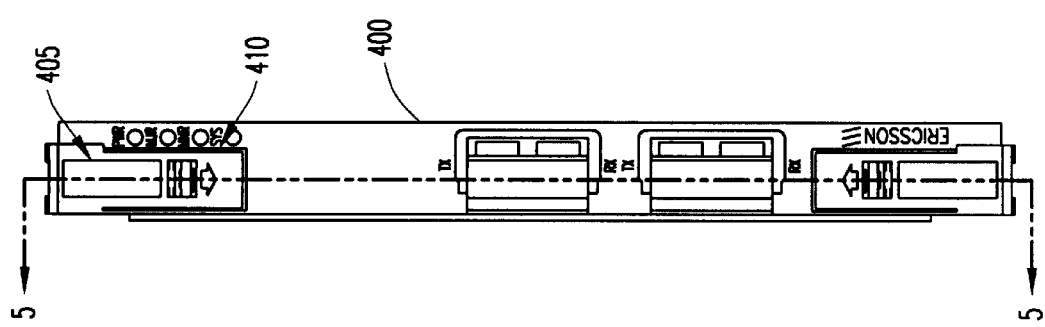
FIG. 4 is a front elevational view of the mounting panel shown in FIG. 3.

With reference now to FIG. 4, there is shown a front elevational view of a mounting panel 400 corresponding to the mounting panel 300 in FIG. 3. In this view, there is illustrated a large inset area 405 provided on each inserter/ejector 410 for labeling an attached PC board. FIG. 5 illustrates a cutaway view of a mounting panel 500 (corresponding to the mounting panel 400 of FIG. 4) along section line 5—5.

Figure 6:
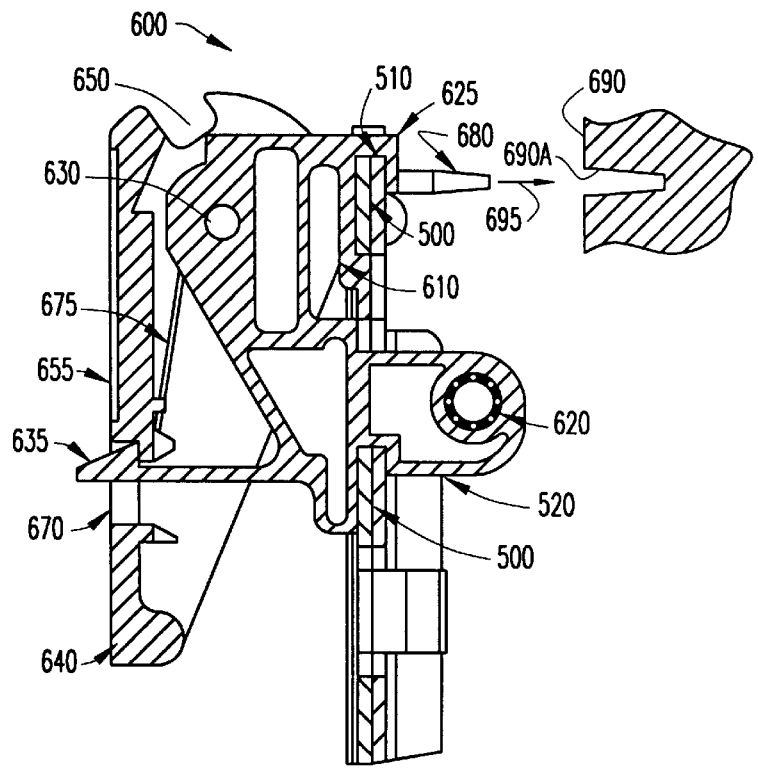
FIG. 6 is a detail view of the panel shown in FIG. 5 illustrating the cutaway inserter/ejector device in greater detail.

With reference now to FIG. 6, a detailed portion of FIG. 5 is shown. This detail shows a cutaway view of a preferred embodiment inserter/ejector 600 of the present invention (corresponding to devices 310 and 410 in FIGS. 3 and 4, respectively). It should be understood that the inserter/ejector 600 may be constructed of any number of suitable materials, but heat resistant, glass-filled thermoplastic composites are generally preferred. Thermoplastics which are well suited to this application include polycarbonate, nylon 6,6 and nylon 6. One presently preferred embodiment material is 20% glass-filled polycarbonate black (G.E. Lexan #3412 or equivalent).

The inserter/ejector 600 preferably includes two molded parts: a body 610 having a mounting portion 620, a lip 625, a board locking mechanism 627 a hinge pin 630, and a locking mechanism 635; and a lever arm 640 having a cutout 650 for contacting a U-channel, an inset label area 655, and opening 670 to allow the lever arm to be pivotally attached to the body 610 by the hinge pin 630 and to interact with the locking mechanism 635.

Prior to attaching to a PCB, the inserter/ejector 600 of the present invention is installed on a mounting panel 500 by positioning the lip 625 of the body 610 over an edge 510 of the panel 500 and snapping the mounting portion 620 through an opening 520 provided in the mounting panel 500. When assembled, inserter/ejector 600 is adjacent a first side 515 of mounting panel 500. Mounting portion 620 extends outwardly from second side 517 of mounting panel 500. This snap-fit design allows the inserter/ejector 600 to be installed rapidly and securely with relative ease. A PCB would then be attached to either side of the mounting portion 620 using a threaded boss or other suitable fastener. The locking mechanism 635 would then be depressed to release the lever arm 640 of the inserter/ejector 600 for installation of the PCB into a larger system, not shown. A wire spring 675 provides sufficient force to hold the lever arm 640 in tension against the locking mechanism 635 when locked and assists in extending the lever arm 640 when unlocked.

After the PCB is attached and the lever arm 640 is extended, the entire unit is ready for insertion into a computer chassis or server. In a preferred embodiment for the inserter/ejector 600, a guide pin 680 extends outward from the lip 625 of the body 610 to assist in aligning the attached PCB. The guide pin 680 may be mated with a rectangular cutout or opening 690B in the chassis of a host system 690 to assure positive location and self-alignment of the PCB therein. After the PCB has been aligned with the appropriate socket or slot 690B, the lever arm 640 may be pushed toward the closed position, causing the cutout portion 650 of the lever arm 640 to exert a significant amount of force upon a U-channel, such as U-channel 200 as depicted earlier in FIG. 2. The locking mechanism 635 passes back though the opening 670 provided in the lever arm 640 and holds the lever arm 640 securely in place to prevent accidental removal or backing out of the PCB without the use of additional screws, pin or rods, as used in previous designs.

For extraction of the PCB, the locking mechanism 635 is again depressed to release the spring tension and to raise the lever arm 640. The lever arm 640 is then extended away from the body 610 to engage the U-channel 200 with the opposite surface of the cutout 650 to create a levered force capable of ejecting the PCB from the slot in which it is seated.

Figure 7:
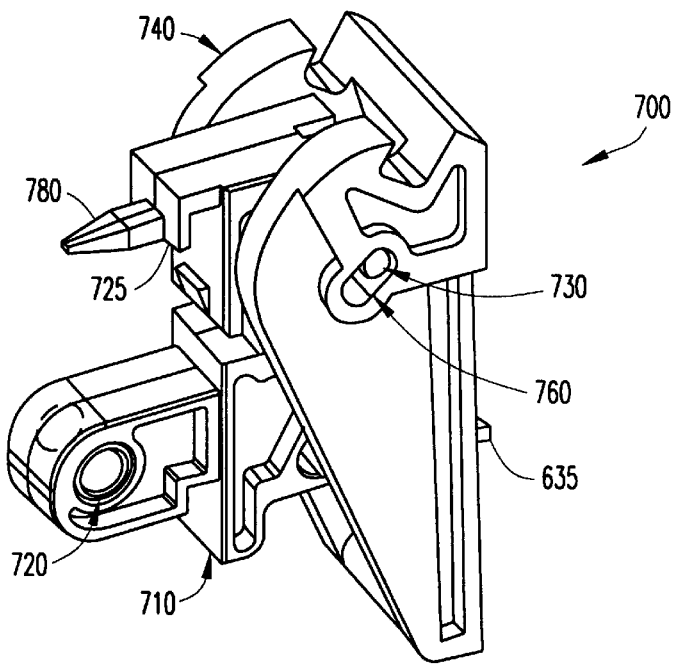
FIG. 7 is a left side perspective view of a preferred embodiment inserter/ejector device of the present invention.

Referring now to FIG. 7, a left side perspective view of a preferred embodiment inserter/ejector 700 is shown. In this figure, a lip 725, a guide pin 780, a mounting member 715 having a mounting portion 720, with a retaining notch 717 and a hinge pin 730 of an inserter/ejector body 710 are clearly visible. A lever arm 740 in this view is folded into the fully inserted or locked position.

To reiterate, the inserter/ejector of the present invention represents several improvements over the prior art. As explained hereinabove, the PCB is attached on either side of the mounting portion using a threaded boss. It should, of course, be understood that other similar threaded fasteners may also be used, but a significant advantage over the art discussed is that there is no longer a need to pre-install one or more pins into the PCB simply to attach the inserter/ejector device thereto. The device implements a lockable lever arm to ensure that the PCB is not accidentally removed or permitted to back out of its slot unless the lever arm is released. The present invention also features a guide pin 680 which, when mated to a corresponding hole 690A in a host system chassis 690 (as indicated by arrow 695), serves to positively locate the PCB for proper insertion within the host system chassis 690. The improved inserter/ejector further includes a relatively large, slightly recessed label area molded into the lever arm for clearly labeling the attached PCB.

It should be understood that the principles of the present invention may be employed for PCB or card thicknesses of a variety of sizes, with thicknesses of 1/16, 3/32 and 1/8 inches being presently preferred. Although there are at present limits on the sizes of the PCBs, the inserter/ejectors and the mounting panels, Applicants envision a potential range of usage from as low as 1/64 to as high as 1/2 inches in card thickness. Corresponding metric dimensions may range from 1 mm to 13 mm. It should, of course, be understood that advances in miniaturization may lower the range even further or applications with similar computer components may raise the range of usage beyond the above range, e.g., the device of the present invention may be designed to group and position multiple PCBs simultaneously. Accordingly, the size of the devices may not necessarily correlate with PCB thickness.

It is believed that the operation and construction of the present invention will be apparent from the foregoing description of a preferred embodiment. While the device shown is described as being preferred, it will be obvious to a person of ordinary skill in the art that various changes and modifications may be made therein without departing from the spirit and scope of the invention as defined in the following claims. Therefore, the spirit and the scope of the appended claims should not be limited to the description of the preferred embodiments contained herein.

What is claimed is:

1. An inserter/ejector for mounting to a printed circuit board for installation into a host system chassis having an actuating surface, said inserter/ejector comprising:

a body having a lower portion including a mounting portion with a fastening means for attaching to said printed circuit board and a retaining notch for engaging a mounting panel, said body further comprising an upper portion having a c-shaped lip that defines a receiving space configured to engage an end of said mounting panel;

a guide pin located on said lip, whereby said guide pin is sized to locate within a mating opening in said host system chassis for establishing a desired relationship between said printed circuit board and said host system chassis;

a lever arm pivotally attached to said body, said lever arm having a cutout for engaging the actuating surface of said host system chassis; and a resilient vertical board locking mechanism extending from an end of the lip and having a locking member thereon for engaging a downwardly facing surface on the mounting panel wherein said mounting panel has a first side that faces away from said mounting portion when said inserter/ejector is installed and a second side that faces said mounting portion when said inserter/ejector is installed and wherein said board locking mechanism is on said first side of said mounting panel and said mounting portion is on said second side of said mounting panel when said board locking mechanism is engaged with said mounting panel.

2. The inserter/ejector according to claim 1, wherein said body further comprises a locking mechanism extending through said lever arm for holding the lever arm in a closed position, wherein said lever arm pivots about a pivot point such that said lever arm is positioned alongside the printed circuit board.

3. The inserter/ejector according to claim 1, wherein said body and said lever arm are formed of a glass-filled thermoplastic composite material.

4. The inserter/ejector according to claim 3, wherein said glass-filled thermoplastic is a polycarbonate.

5. The inserter/ejector according to claim 1, wherein said lever arm further comprises an inset label area.

6. A mounting panel combination comprising:

a mounting panel having a first side facing away from a host system chassis and a second side facing the host system chassis;

a printed circuit board, said printed circuit board having an end;

at least one inserter/ejector device attached to said mounting panel, said at least one inserter/ejector device comprising:

a body having a lower portion including a mounting portion with a fastening means for attaching to said printed circuit board and a retaining notch for engaging a mounting panel, said body further comprising an upper portion having a c-shaped lip that defines a receiving space configured to engage an end of said mounting panel;

said upper portion including a resilient vertical board locking member extending from said upper portion on said first side of said mounting panel, said board locking member having a locking member for engaging a downwardly facing surface on said mounting panel;

a lever arm pivotally attached to said body, said lever arm having a cutout for engaging an actuating surface of the host system chassis housing said printed circuit board;

a c-shaped lip on said upper portion of said body configured to snap-fit with an end of said mounting panel; and said upper portion of said body further comprising a guide pin on said lip and on said second side of said mounting panel, whereby said guide pin is sized to locate within a mating opening in said host system chassis for establishing a desired relationship between said printed circuit board and said host system chassis.

7. The mounting panel combination according to claim 6, wherein said body further comprises a locking mechanism extending through said lever arm for holding the lever arm in a closed position.

8. The mounting panel combination according to claim 6, wherein said body and said lever arm are formed of a glass-filled thermoplastic composite material.

9. The mounting panel combination according to claim 8, wherein said glass-filled thermoplastic is a polycarbonate.

10. The mounting panel combination according to claim 6, wherein said lever arm further comprises an inset label area.

11. The mounting panel combination according to claim 6, wherein two of said inserter/ejector devices are attached to said mounting panel.

12. An inserter/ejector device comprising:

a body having a lower portion including a mounting portion and a retaining notch, said mounting portion of said mounting member for engaging a printed circuit board, and said retaining notch for engaging a mounting panel;

said body having an upper portion including a vertical resilient board locking mechanism on a side of said mounting panel and having a locking member thereon for engaging a downwardly facing surface on said mounting panel, said upper body further defining a c-shaped lip for engaging an end of said mounting panel, said lip having a guide pin on an opposite side of said mounting panel;

a lever arm pivotably attached to said body; and securing means for securing said inserter/ejector device to said mounting panel by locking said lever arm in a locked position.

13. The inserter/ejector device according to claim 12, further comprising:

an alignment means extending from said mounting member of said body on said lip, said alignment means aligning said inserter/ejector device to said mounting panel.

14. The inserter/ejector device according to claim 12, further comprising:

an inset area on a surface opposite said mounting member for labeling said mounting panel.

15. An inserter/ejector for mounting to a printed circuit board for installation into a host system chassis having an actuating surface, said inserter/ejector comprising:

body having a lower portion having a mounting portion with a fastening means for attaching to said printed circuit board;

a lever arm pivotally attached to said body, said lever arm having a cutout for engaging the actuating surface of said host system chassis;

a retaining notch in said mounting portion for engaging a mounting panel;

a resilient vertical board locking mechanism having a locking member for engaging a downwardly facing surface in said mounting panel wherein said board locking mechanism is on a side of said mounting panel when said board locking mechanism is engaged with said mounting panel;

a locking mechanism that extends through said lever arm for securing the lever arm when said lever arm is in a closed position;

a c-shaped lip configured to snap-fit with an end of a mounting panel; and a guide pin located on said lip on an opposite side of said mounting panel.

16. A mounting panel combination comprising:

a printed circuit board, said printed circuit board having an end;

at least one inserter/ejector device attached to said mounting panel said at least one inserter/ejector device comprising:

a body having a lower portion including a mounting portion with a fastening means for attaching to a side portion of said printed circuit board, said fastening means adapted to be positioned on a side of a mounting panel;

a lever arm pivotally attached to said body, said lever arm having a cutout for engaging an actuating surface of a host system chassis housing said printed circuit board;

a retaining notch in said mounting portion for engaging said mounting panel;

a vertical resilient board locking mechanism having a locking member for engaging a downwardly facing surface on said mounting panel wherein said board locking mechanism is on said opposite side of said mounting panel when said board locking mechanism is engaged with said mounting panel;

said body having an upper portion including a c-shaped lip configured to snap-fit with an end of said mounting panel;

a guide pin extending from said lip; and a locking mechanism extending from said body for holding the lever arm in a closed position.

* * * * *